United States Patent [19]

Ash

[11] Patent Number: 4,650,542
[45] Date of Patent: Mar. 17, 1987

[54] PROCESS AND APPARATUS FOR CHEMICALLY TREATING ARTICLES IN A CONTAINED CHAMBER, WITH SEALED-DOOR ACCESS TO THE CHAMBER

[75] Inventor: James J. Ash, Centre Hall, Pa.
[73] Assignee: Chemcut Corporation, State College, Pa.
[21] Appl. No.: 807,352
[22] Filed: Dec. 10, 1985
[51] Int. Cl.$^4$ .................... B44C 1/22; C03C 15/00; C03C 25/06
[52] U.S. Cl. .................................... 156/640; 156/901; 156/345
[58] Field of Search ............ 156/640, 642, 656, 659.1, 156/664, 665, 901, 902, 345; 134/144, 148, 198

[56] References Cited
U.S. PATENT DOCUMENTS 3,756,898  9/1973  Frantzen et al. .................... 156/345
4,011,123  3/1977  Buysman ............................ 156/345
4,151,034  4/1979  Yamamoto et al. ................ 156/345

Primary Examiner—William A. Powell
Attorney, Agent, or Firm—Paul & Paul

[57] ABSTRACT

A method and apparatus is provided for chemically treating articles, generally in a corrosive environment by etching or the like, where a corrosive substance is applied to the articles being delivered through a substantially closed chamber. The chamber is provided with access through an openable door, and a seal is provided between the door and the wall of the chamber. The seal is flexible and is inflatable, to prevent a treatment fluid with which articles are being treated within the chamber, from being dispersed from inside the chamber to outside the chamber at the juncture of the door with the wall of the chamber in which the door is located. The seal is expanded by means of a fluid pressure, and is releasable upon desired access to the chamber.

24 Claims, 5 Drawing Figures

PROCESS AND APPARATUS FOR CHEMICALLY TREATING ARTICLES IN A CONTAINED CHAMBER, WITH SEALED-DOOR ACCESS TO THE CHAMBER

BACKGROUND OF THE INVENTION

In the manufacture of printed circuit boards, printed circuit elements and like goods, and in processes in connection with the same, it has become commonplace to deliver the articles, such as printed circuit boards, through a chamber in a continuous manner, while the articles are being treated by the spray of a suitable treatment fluid, such as an etchant onto them. Generally, the etchant is of a corrosive nature, such as ammonium hydroxide and ammonium chloride, with a suitable chelating or complexing agent, although other etchants or treatment fluids may also be utilized. See, for example, U.S. Pat. No. 4,233,106, the disclosure of which is herein incorporated by reference.

Most particularly, when the treatment fluids are corrosive in nature, and are dangerous to personnel handling the apparatus, particularly to the skin, eyes, etc., of such personnel, and particularly to nearby equipment as well, it is desirable to prevent access by such personnel to such treatment fluid.

In the course of preventing such access, it has been known to perform the various treatments in chambers, with limited, slit-like access at the inlets and outlets thereof to the treatment chambers. See, for example, U.S. Pat. Nos. 3,776,800 and 4,015,706, the entire disclosures of which are herein incorporated by reference.

In many such operations, it is desirable to provide access to the interior of the chamber by personnel, which access may readily be obtainable upon opening or removing a door or the like, for purposes of repair, cleaning, correcting some malfunction, or for any myriad of reasons that may dictate the desirability of access to the interior of the chamber.

PRESENT INVENTION

The present invention is directly toward effecting the treatment of articles, in such a manner that the same may be done in sealed-off arrangement relative to the exterior of the chamber (except as to inlet and outlet access for articles entering and leaving the chamber), and principally in such a manner as to effect a seal of the access door to the wall of the chamber in which such door exists, and especially to do so in such a manner that the seal is fluid-tight and can prevent fluid from the interior of the chamber from contaminating the working environment outside the chamber through the closed access door.

SUMMARY OF THE INVENTION

The present invention is therefore directed toward the chemical treatment of articles in a substantially closed chamber, in which access to the chamber by means of a door through a wall, may be securely provided, but may be released when desired to facilitate access to the interior of the chamber.

Accordingly, it is a primary object of this invention to provide a method of treating articles under conditions of novel controlled access to the interior of the chamber in which the articles are being treated.

It is a further object of this invention to accomplish the above object, in which an access door to the interior of the chamber may be effectively sealed by means of a fluid-pressure-operative seal, but which may be releasably de-actuated, for access to the interior of the chamber.

It is a further object of this invention to provide an apparatus for treating articles in a substantially closed chamber, but wherein the chamber is provided with an access door that may be selectively sealed or unsealed, depending upon whether or not access is desired to the chamber.

It is a further object of this invention to accomplish the above object, wherein the door is provided with an expansible fluid-operative seal that may be selectively actuated or de-actuated, depending upon the restriction of access to, or desired access to, the interior of the chamber.

Other objects and advantages of the present invention will be readily apparent to those skilled in the art, from a reading of the following brief descriptions of the drawing figures, detailed description of the preferred embodiment, and the appended claims.

IN THE DRAWINGS

DETAILED DESCRIPTION OF THE PREFERRED EMBODIMENT

Figure 1:
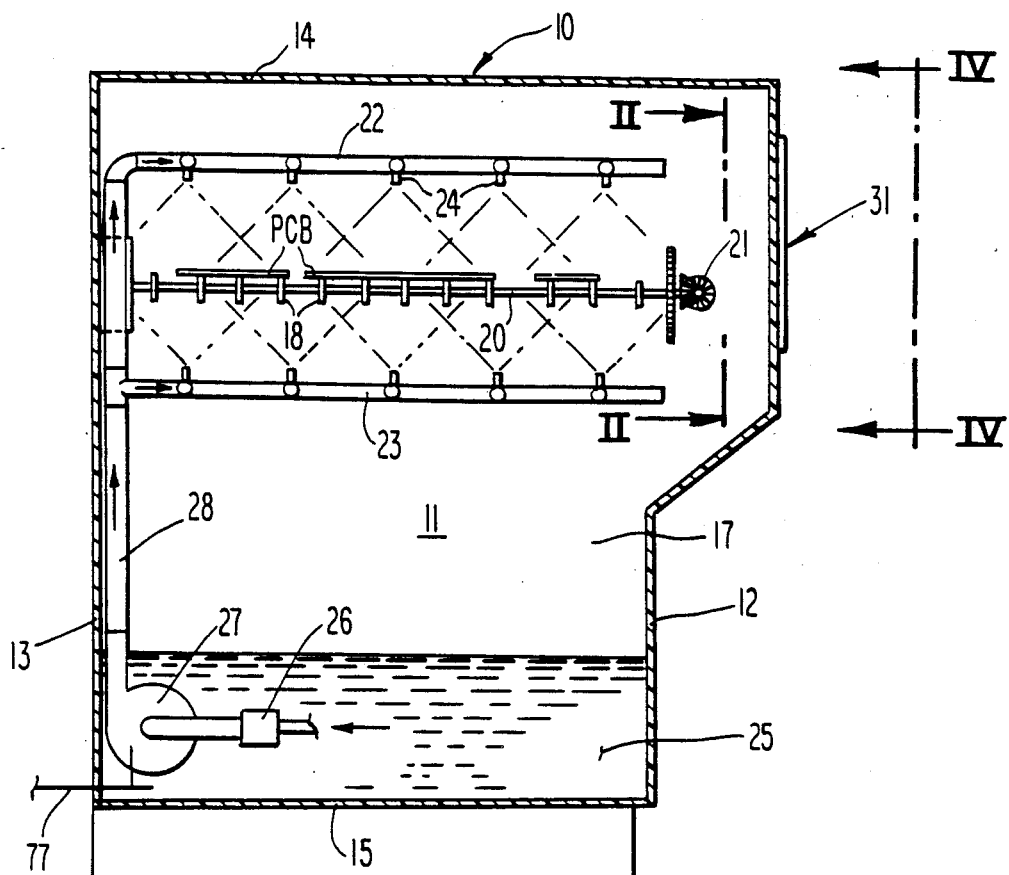
FIG. 1 is a vertical sectional view, taken transverse of a chamber that is designed to practice the method of this invention, wherein the path of flow of articles through the chamber is indicated as being into the plane of the paper, and wherein the various functional components of the operation in the chamber are principally illustrated.

Referring now to the drawings in detail, reference is first made to FIG. 1, wherein there is illustrated a chamber generally designated by the numeral 10, having an interior 11, defined by front and back walls 12 and 13, respectively, upper and lower walls 14 and 15, respectively, and opposed end walls, only one of which is indicated by the numeral 17.

Printed circuit boards PCB or other articles being treated, pass through the chamber 10, in a direction into the plane of the paper, as illustrated, being driven through the chamber 10 by means of a drive mechanism similar to that set forth in U.S. Pat. No. 4,015,706, the disclosure of which is herein incorporated by reference. For purposes of brevity, the articles are driven by means of wheels 18 carried by rods 20, which rods 20 are rotatably driven at their ends by a suitable gear drive 21, with the gear drive 21 being driven by a suitable motor (not shown) that does not form a specific part of this invention.

The etchant or other treatment fluid is delivered from a suitable interior line 28, to preferably upper and lower spray headers 22 and 23, to deliver the treatment fluid through a plurality of spray nozzles or the like 24, to upper and lower ends of the articles being treated, as illustrated in FIG. 1. Suffice it to say, as the articles being treated move from one end to the other, 17 of the apparatus, as is described more fully in U.S. Pat. No. 4,015,706, they will generally be subjected to a number of similar spray treatments to that illustrated in FIG. 1. The treatment fluid is collected at the lower end of the chamber 11, at 25, for reuse, and such may be effected by delivering the same, preferably through a filter 26, to a pump 27, to be returned to the spray headers 22 and 23 via line 28, as illustrated, for recirculation of the fluid in that manner.

As aforesaid, the treatment fluid will generally be an etching fluid or an oxidation/reduction fluid, or a treatment fluid related to such an etching or like chemical treatment operation, and, it will therefore be desired that a treatment fluid be restrained, during the treatment operation, from passing outwardly of the chamber, through walls thereof, so as not to contaminate the exterior environment and/or personnel outside the chamber.

Figure 5:
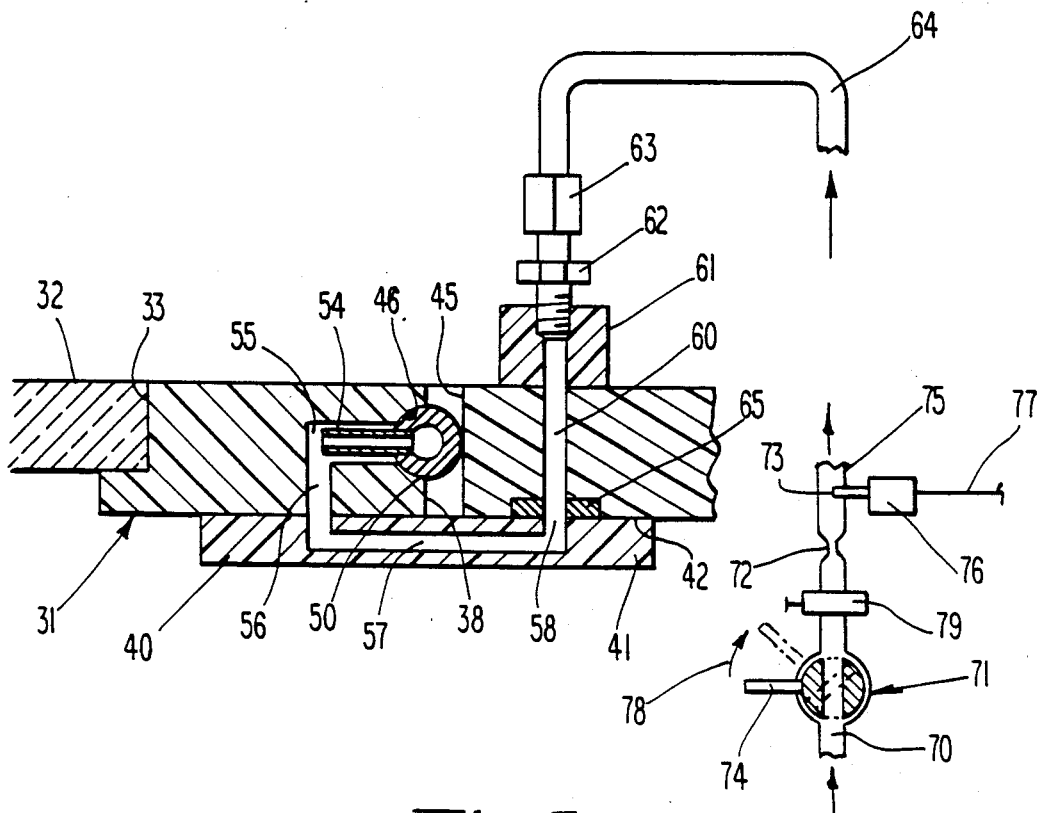
FIG. 5 is an enlarged fragmentary cross-sectional view, partially in schematic, of the juncture of a portion of the door of the chamber with the wall of the chamber, as well as the apparatus and technique for expanding the door seal by means of fluid.

The upper portion of the wall 30 is provided with a removable door 31 therein. The door 31 is provided with a preferably transparent rectangular plate 32, situated in, and sealingly secured to a notched opening 33 in a frame portion 34 by means of a suitable bonding means. The frame portion 34 is defined by flattened peripheral portions 35, 36, connected by arcuate portions 37, which, aggregatively define the periphery 38 of the door. The frame portion 34 carries a flange plate 40 secured thereto, such that, when the door 31 is applied to the wall 30, from the exterior of the chamber 10, the protruding lip 41 of the flange portion engages against an adjacent surface 42 of the wall portion 30, as illustrated in FIG. 5. It will thus be apparent that the peripheral surface 38 of the door 31 faces a complementally configured surface 45 of the wall portion 30, which comprises means facilitating the closing of the door, as does the flange plate 40.

Figures 2, 3:
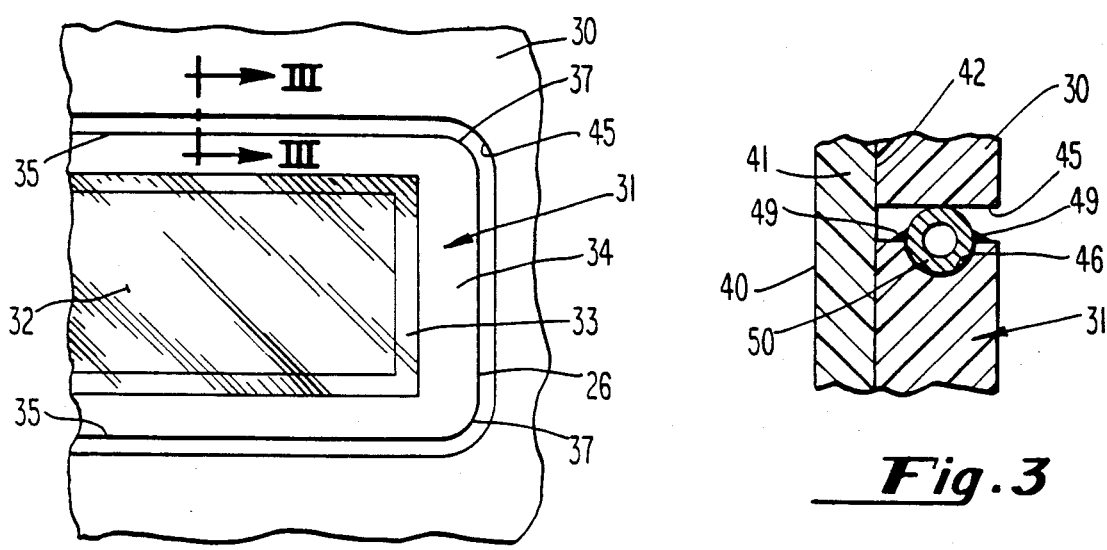
FIG. 2 is an enlarged fragmentary elevational view of a portion of the openable door in a wall of the chamber, and wherein the general design of the door is illustrated, with the view being taken generally along the line of II—II of FIG. 1.
FIG. 3 is a more highly enlarged, fragmentary, vertical sectional view, taken through the door and wall of FIG. 2, generally along the line III—III of FIG. 2, and wherein the expansible seal is more clearly illustrated.
Figure 4:
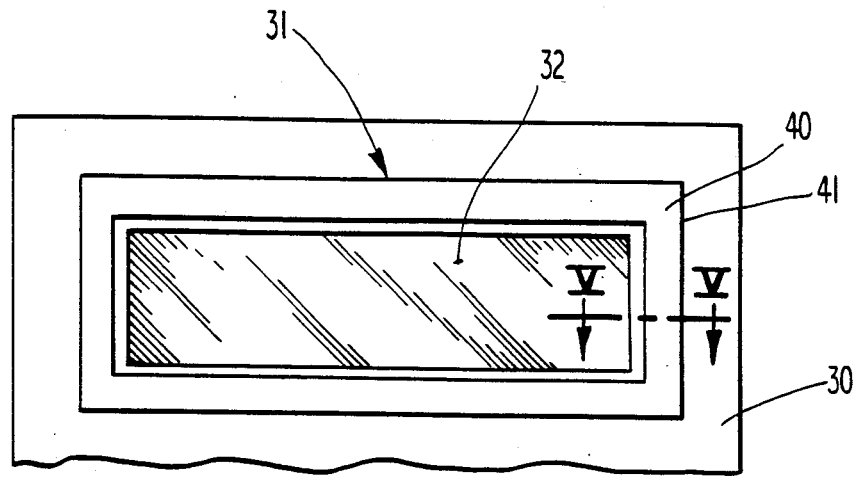
FIG. 4 is a fragmentary vertical elevational view, of the wall of the chamber of the apparatus of this invention, taken generally along the line of IV—IV of FIG. 1, wherein the arrangment of the door and the wall of the chamber is illustrated.

The surface 38 of the door has an arcuate, generally semispherical (in transverse section) groove 46 therein, which receives a hollow tubular seal 50 therein, to be carried by the door 31. The seal 50 is continuous around the periphery of the door, preferably bonded in place on each side of the groove 46, on surface 38 thereof at 49 as shown in FIG. 3, and forms a closed fluid-containing loop therein, with opposite ends of the hose-like structure brought together and sealed (not shown) to complete the loop. The seal 50 is adapted to receive a compressed fluid, such as compressed gas therein, to effectively expand the seal 50 radially outwardly as viewed in FIGS. 3 and 5, to tightly, frictionally engage against surface 45 in the wall portion 30, to sealingly engage the removable door 31, relative to the wall portion 30.

It will be noted that the seal 50 is constructed of a corrosion-resistant material, such as a suitable plastic or the like, hose-like material, suitable for the environment in which it is operating, and being generally flexible and expansible upon receipts of air or other fluid applied to the interior 53 thereof. Similarly, the other structural components of the chamber, such as the walls thereof, will preferably be constructed of a polypropylene, stainless steel, or other suitable materials that are able to withstand a corrosive environment.

The seal 50 will preferably be provided a suitable inlet port, in the form of a protruding nipple 54 that extends into a blind bore 55 for accommodating the same, from the bottom of the arcuate groove or recess 46 in peripheral wall 38 of the door, and this blind bore 55 communicates with a transverse bore 56, extending through door frame 34, as illustrated in FIG. 5, into the flange portion 40 carried thereby, to, in turn, meet with a communicating, longitudinal bore 57 therein, which, in turn, communicates with another transverse bore 58 in the frame number 40. A transverse bore 60 is disposed in wall portion 30, as illustrated in FIG. 5, and this communicates with a mounting block 61, inwardly of the wall portion 60, to carry a fluid fitting 62, coupling 63, and fluid inlet hose 64, as illustrated.

A sealing grommet 65 is provided, recessed in the outer surface of wall portion 30, as illustrated in FIG. 5, carried thereby, but with an opening therethrough, as illustrated, to form a part of the conduit 60, such that, upon placement of the door 31 in the opening in the wall portion 30, such that the flange portion 40 is disposed against the wall portion 30, as illustrated in FIG. 5, the transverse conduit 58 in the flange portion will register with, and communicate with the conduit portion 60 in the wall portion 30, in such a way that the sealing grommet 65 will seal the meeting surfaces against escape of fluid from the conduit portions 60 and 58, but will permit communication of fluid between the conduit portions 58 and 60, from one to the other.

In operating in accordance with the present invention, the door 31 will be provided in the wall portion 30 of the chamber, with the closed flexible and hollow seal 50 therein, as aforesaid. Then, seal-expanding fluid, such as compressed gas or the like, will be delivered by means not shown to line 70, through a preferably manual ball valve or the like 71, suitably actuated by preferably manual handle 74 to open and permit passage of the fluid from line 70, through valve 71, through manually operable pressure regulator 79, through constricting orifice 72, into line 75, when the valve handle 74 is in the full line operation shown in FIG. 5, to be delivered to flexible hose or the like 64, and eventually through the conduits 60, 57, 56, 55, into the inlet port 54 of the seal, and then into the interior 53 of the seal, to expand the same into tight frictional engagement against the surface 45 of the wall portion 30, to be in sufficiently tight engagement thereagainst as to prevent manual removal of the door, until release of pressure within the seal 50 is effected. A pressure sensor 73, preferably of the transducer type, is provided to sense a reduction of pressure in the line 75 (which reflects an insufficiently tight sealing of the door 31), and actuates a control device 76 which is connected via line 77 to shut down the pump 27, and to discontinue the treatment operation in the chamber, until the door seal is properly pressurized or the malfunction properly corrected. Accordingly, the pressure to the seal 50 will be maintained during the application of treatment fluid to the articles being treated within the chamber.

When it is desired to open the door, the manual activator or handle 74 may be engaged and moved in the direction of arrow 78 to assume the approximate position illustrated in phantom in FIG. 5, to close the ball valve 71, whereby pressure will no longer be provided therethrough to line 75, and whereby pressure that is within the seal 50 may be released, as, in the case of air being the fluid, to discharge to atmosphere (not shown) through bleed type regulator 79. It will also be apparent that, in times of emergency or the like, wherever access to the interior of the chamber 10 is desired, the control mechanism may be activated by means of the lever arm 74 or the like, to release fluid from the seal, in the manner just described.

It will be apparent from the foregoing that various modifications may be made in the details of construction, as well as in the use and operation of the preferred invention, all within the spirit and scope of the invention as defined in the appended claims. While the door of the apparatus of this invention is thus described, it will be apparent that the same terminology aptly describes a window or any other access panel or other structure where a sealed-closed arrangement is desired.

What is claimed is:

1. In a process for chemically treating articles in a corrosive environment by etching or like chemical treatment, wherein a corrosive substance is applied to articles being delivered through a substantially closed chamber in which there is an openable door in the wall of the chamber, the method of providing the treatment under releasable but sealed-door conditions at the closing juncture of the door and wall by the steps of:
   (a) providing an openable door in a wall of the chamber;
   (b) providing an expansible, hollow flexible fluid-receiving seal at the closing juncture of the wall and the door, about the periphery thereof;
   (c) closing the door relative to the wall of the chamber;
   (d) providing under pressure, a seal-expanding fluid to the hollow seal, to expand the seal at its juncture with the door and seal the periphery of the door relative to the wall against passage of the corrosive substance in the chamber, outwardly, through the juncture of the door and wall;
   (e) maintaining a door-sealing pressure on the fluid while articles are being treated in the chamber;
   (f) treating the article in the chamber with a corrosive substance while the door is in the closed, sealed condition; and
   (g) actuating a release of fluid pressure to the hollow seal after the articles are treated in the chamber, to release the seal at its juncture with the door and wall.

2. The process of claim 1, wherein the step of providing the seal includes providing a seal partially embedded in one of the door and the wall and partially projecting out thereof toward the other of the door and the wall, and substantially completely around the juncture thereof.

3. The process of claim 2, wherein the step of providing seal-expanding fluid includes providing the fluid under sufficient pressure to expand the seal to sufficient engagement with the other of said door and wall to prevent ready manual opening of the door prior to release of the fluid pressure.

4. The process of claim 2, wherein the step of providing seal-expanding fluid includes delivering a pressurized fluid to a seal in the door, through fluid-delivery conduit portions extending through both the door and the wall.

5. The process of claim 4, wherein the step of closing the door includes bringing a conduit portion in the door and a conduit portion in the wall, into sufficient registration for fluid-delivering communication therebetween.

6. The process of claim 5, wherein the step of closing the door includes sealing the fluid-delivery conduit portions of the door and wall as they are brought into registration, against escaped of pressurized fluid out of the conduit portions, other than from one conduit portion to another.

7. The process of claim 3, wherein the actuating step includes manually activating a control mechanism to release fluid from the seal and to thereby release the pressure in the seal and permit opening of the door.

8. The process of claim 3, wherein the expansion of the seal under fluid pressure is an expansion into tight frictional engagement with the other of the door and seal.

9. The process of claim 3, wherein the step of providing seal-expanding fluid. includes delivering a pressurized fluid to a seal in the door, through fluid-delivery conduit portions extending through both the door and the wall, wherein the step of closing the door includes bringing a conduit portion in the door and a conduit position in the wall into sufficient registration for fluid-delivering communication therebetween, wherein the step of closing the door includes sealing the fluid-delivery conduit portions of the door and wall as they are brought into registration, against escape of pressurized fluid out of the conduit portions other than from one conduit portion to another, wherein the actuating step includes manually acitvating a control mechanism to release fluid from the seal and to thereby release the pressure in the seal and permit opening of the door, and wherein the expansion of the seal under fluid pressure is an expansion into tight frictional engagement with the other of the door and seal.

10. In an apparatus for chemically treating articles in a corrosive environment by etching or like chemcial treatment, wherein a corrosive substance is applied to articles being delivered through a substantially closed chamber in which there is an openable door in the wall of the chamber, a device for providing the treatment under releasable but sealed-closed conditions at the closing juncture of the door and wall, including:
   (a) an openable door in a wall of the chamber;
   (b) an expansible, hollow flexible fluid-receiving seal means at the closing juncture of the wall and the door, about the periphery thereof;
   (c) means facilitating closing the door relative to the wall of the chamber;
   (d) means for providing under pressure, a seal-expanding fluid to the hollow seal means, to expand the seal means at its juncture with the door and seal the periphery of the door relative to the wall against passage of the corrosive substance in the chamber, outwardly, through the juncture of the door and wall;
   (e) means for maintaining a door-sealing pressure on the fluid while articles are being treated in the chamber;
   (f) means for treating the article in the chamber with a corrosive substance while the door is in the closed, sealed condition; and
   (g) means for actuating a release of fluid pressure to the hollow seal means after the articles are treated in the chamber, to release the seal means at its juncture with the door and wall.

11. The apparatus of claim 10, wherein the seal means includes a seal partially embedded in one of the door and the wall and partially projecting out thereof toward the other of the door and the wall, and substantially completely around the juncture thereof.

12. The apparatus of claim 11, wherein the means for providing seal-expanding fluid includes means for providing the fluid under sufficient pressure to expand the seal to sufficient engagement with the other of said door and wall to prevent ready manual opening of the door prior to release of the fluid pressure.

13. The apparatus of claim 12, wherein the means for providing seal-expanding fluid includes means for delivering a pressurized fluid to a seal in the door, through fluid-delivery conduit portions extending through both the door and the wall.

14. The apparatus of claim 13, wherein the means facilitating closing the door includes a conduit portion in the door and a conduit portion in the wall, in sufficient registration in the door-closed condition, for fluid-delivering communication therebetween.

15. The apparatus of claim 14, wherein the means facilitating closing the door includes means for sealing the fluid-delivery conduit portions of the door and wall as they are brought into registration, against escape of pressurized fluid out of the conduit portions, other than from one conduit portion to another.

16. The apparatus of claim 12, wherein the actuating means includes means for manually activating a control mechanism to release fluid from the seal and to thereby release the pressure in the seal and permit opening of the door.

17. The apparatus of claim 12, wherein, in the closed condition of the door, the seal is expanded into tight frictional engagement with the other of the door and seal.

18. The apparatus of claim 12, wherein the means for providing seal-expanding fluid includes means for delivering a pressurized fluid to a seal in the door, through fluid-delivery conduit portions extending through both the door and the wall, wherein the means facilitating closing the door includes a conduit portion in the door and a conduit portion in the wall, in sufficient registration in the door-closed condition, for fluid-delivering communication therebetween, wherein the means facilitating closing the door includes means for sealing the fluid-delivery conduit portions of the door and wall as they are brought into registration, against escape of pressurized fluid out of the conduit portions, other than from one conduit portion to another, wherein the actuating means includes means for manually activating a control mechanism to release fluid from the seal and to thereby release the pressure in the seal and permit opening of the door, wherein, in the closed condition of the door, the seal is expanded into tight frictional engagement with the other of the door and seal.

19. An apparatus for treating articles as part of an etching or like chemical treatment operation, in a substantially closed chamber, said apparatus comprising:
 (a) a substantially closed chamber with an openable door in a wall of the chamber defining a closing juncture therewith at about the periphery of the door;
 (b) an expansible, hollow flexible fluid-receiving seal means at the closing juncture of the wall and the door, about the periphery thereof;
 (c) means facilitating the closing of the door relative to the wall of the chamber;
 (d) means for providing under pressure, a seal-expanding fluid to the hollow seal means, to expand the seal means at its juncture with the door and seal the periphery of the door relative to the wall;
 (e) means for maintaining a door-sealing pressure on the fluid while articles are being treated in the chamber;
 (f) means for treating articles in the chamber while the door is in the closed, sealed condition; and
 (g) means for actuating a release of fluid pressure to the hollow seal means after the articles are treated in the chamber, to release the seal means at its juncture with the door and wall.

20. The apparatus of claim 19, wherein the seal means includes a seal partially embedded in one of the door and the wall and partially projecting out thereof toward the other of the door and the wall, and substantially completely around the juncture thereof.

21. The apparatus of claim 20, wherein the means for providing seal-expanding fluid includes means for providing the fluid under sufficient pressure to expand the seal to sufficient engagement with the other of said door and wall to prevent ready manual opening of the door prior to release of the fluid pressure.

22. The apparatus of claim 21, wherein the means for providing seal-expanding fluid includes means for delivering a pressurized fluid to a seal in the door, through fluid-delivery conduit portions extending through both the door and the wall.

23. The apparatus of claim 22, wherein the means for securing the door in the closed position includes a conduit portion in the door and a conduit portion in the wall, in sufficient registration in the door-closed condition, for fluid-delivering communication therebetween.

24. The apparatus of claim 21, wherein the actuating means includes means for manually activating a control mechanism to release fluid from the seal and to thereby release the pressure in the seal and permit opening of the door.

* * * * *